May 24, 1960 F. R. NOLL 2,938,130

SEMI-CONDUCTOR DEVICE FOR HEAT TRANSFER UTILIZATION

Filed Sept. 27, 1957

Inventor:
Frank R. Noll,
by
Attorneys

United States Patent Office 2,938,130

Patented May 24, 1960

2,938,130

SEMI-CONDUCTOR DEVICE FOR HEAT TRANSFER UTILIZATION

Frank R. Noll, Fort Wayne, Ind., assignor to International Telephone and Telegraph Corporation Filed Sept. 27, 1957, Ser. No. 686,693

1 Claim. (Cl. 307—88.5)

This invention relates to a semi-conductor device, such as transistors, and more particularly to means for abstracting heat from such devices.

One of the principal limitations in the employment of power transistors has been their ability to dissipate heat to a chassis or other mounting means. Power transistors, i.e., those employed in the control of appreciable power, as in audio and control circuits, as distinguished from those which control merely minute quantities of power, as in radio frequency circuits, conventionally have the collector connected to the enclosing metal case. The principal source of internal heat generation in such power transistors is the collector portion, however, the collector commonly is so connected in the circuit that it is at a potential above ground whereas the chassis or mounting panel of the equipment on which it is desired to mount the transistor is generally at ground potential. It has thus in the past been generally necessary to insulate the transistor case from the chassis by such means as a mica washer, however, this necessary electrical insulation is also an inherent heat insulator and thus the ability of the transistor case to dissipate heat to the chassis is seriously affected.

It is therefore desirable to provide a semi-conductor device such a transistor, in which the case may be mounted upon the chassis in good heat-transfer relationship while nevertheless blocking current flow from the case to the chassis. My invention in its broader aspects provides a semi-conductor device having at least one N-type and one P-type region with means forming a junction diode with one of these regions and connected to the mounting means so that heat is readily conducted to the mounting means from the semi-conductor device while current flow to the mounting means is blocked. In a specific embodiment of my invention, a transistor having N-type and P-type regions respectively forming a base, collector, and emitter is provided with the collector being back-biased to a source of direct current potential. A member formed of semi-conductor material having a polarity opposite from the polarity of the collector is provided forming a junction diode with the collector and connected to the mounting means in heat-transfer relationship. Since semi-conductor material such as selenium and germanium are good heat conductors, it will be readily seen that the heat generated in the collector region of the transistor is conducted to the mounting means, however, by virtue of the back-bias connection of the collector and the opposite polarity of the semi-conductor member, current flow from the source to the mounting means through the semi-conductor member is blocked.

It is therefore an object of this invention to provide improved means for cooling a semi-conductor device.

Another object of this invention is to provide an improved transistor construction in which internal heat may be more readily conducted to a mounting means.

A further object of this invention is to provide improved means for abstracting heat from presently commercially available transistors.

The above mentioned and other features and objects of this invention and the manner of attaining them will become more apparent and the invention itself will be best understood by reference to the following description of an embodiment of the invention taken in conjunction with the accompanying drawings, wherein.

Figure 1:
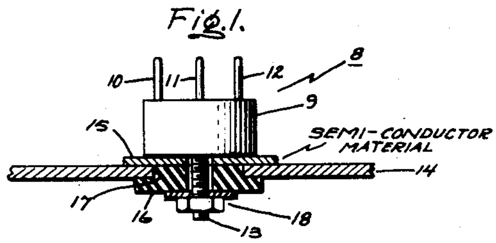
Fig. 1 is a side elevational view, partly in section, illustrating the application of my improved means for abstracting heat from a semi-conductor device to a commercially available type of power transistor.
Figure 2:
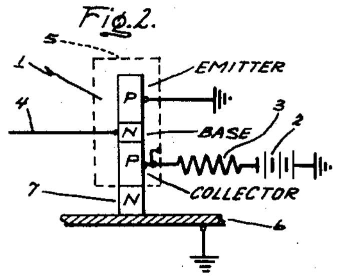
Fig. 2 is a schematic illustration showing my invention as applied to a P-N-P transistor.
Figure 3:
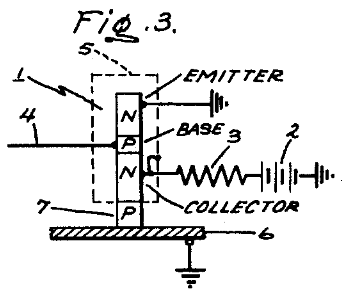
Fig. 3 is another schematic illustration showing the application of my invention to an N-P-N transistor.

Referring now to Figs. 1, 2 and 3, it will be recalled that a transistor comprises a semi-conductor crystal 1, such as germanium, in which by the addition of suitable impurities, as is well known in the art, P-type and N-type regions are formed. In the transistor shown in Fig. 2, the crystal 1 has been formed with P-N-P regions with the central N-type region forming the base and with the two P-type regions forming the collector and emitter respectively. Here, the collector region of the crystal 1 is back-biased, i.e., connected to the negative side of a suitable source of direct current potential, shown here as being battery 2, by a load resistor 3, the positive side of battery 2 being shown as connected to ground. The emitter may also be connected to ground and the base may be connected by a lead 4 into the remaining circuit so that the control signal is impressed therein, as is well known in the art.

It will now be readily seen that with the collector back-biased negatively as shown, and with no signal voltage applied on the base, only a minute leakage current will flow through the crystal 1 from the emitter to the collector. However, if a sufficiently negative signal is applied to the base such that a small current flows from the collector to the base, a greatly increased current will flow in the collector-emitter circuit. It will now be seen that the collector of the crystal 1 is at a potential below ground and, as indicated above, it is common practice to connect the collector to the enclosing metal case of the transistor for best heat dissipation since the major amount of the heat generated in the transistor is generated in the collector region. It will however be seen that the enclosing case, indicated by the dashed lines 5, cannot be directly mounted upon the chassis or mounting panel 6, which generally is at ground potential, since current would thus flow from the source 2 directly to the panel 6. In accordance with my invention, therefore, I provide an additional semi-conductor member 7, such as germanium or selenium, having a polarity opposite from that of the collector region of the crystal 1 and forming a junction diode therewith, the member 7 being directly connected in heat-transfer relationship to the panel 6. It will now be seen that the semi-conductor member 7, being a good conductor of heat, will abstract heat from the collector region of the crystal 1 and conduct it to the panel 6, however, it will also be seen that the junction-diode formed by the semi-conductor member 7 and the collector is polarized to block any flow of current from the source 2 to the panel 6.

Reference to Fig. 3 in which like parts are indicated by like reference numerals will show that my invention is equally applicable to a transistor of the N-P-N type. Here, the collector region of the crystal 1 is back-biased to the positive side of battery 2 and thus only minimum leakage current will flow in the collector-emitter circuit under the influence of the battery 2 when no signal is applied to the base. With this transistor construction, semi-conductor member 7 is again polarized oppositely from the collector, i.e., with a P-region forming a junction diode with the collector and it will again be seen that while heat is readily conducted from the collector to the panel 6, current flow from the battery 2 to the panel 6 is again effectively blocked.

Referring now to Fig. 1, there is shown an application of my invention to a presently commercially available power transistor 8 having an enclosing metal case 9 which is connected to the collector of the crystal in accordance with conventional practice. Terminals 10, 11 and 12 are respectively connected to the emitter, base and collector elements of the crystal, and a mounting stud 13 extends from the bottom of the transistor 8 and is connected to the case 9; the stud 13 is thus at the same potential as the case 9 and the collector. When it is desired to mount transistor 8 on a chassis 14 formed of relatively thin conductive material, such as aluminum, it has been conventional practice to insulate the case 9 from the panel 14 by such means as a mica washer. In accordance with my invention, I provide a washer 15 formed of suitable semi-conductor material such as selenium or germanium respectively abutting the bottom of the case 9 of transistor 8 and the upper surface of panel 14. If the transistor 8 is of the P-N-P type, as shown in Fig. 2, the semi-conductor washer 15 has its N-side abutting the bottom of case 9 thereby forming a junction diode therewith whereas if the transistor 8 is the N-P-N type, as shown in Fig. 3, the semi-conductor washer 15 is merely reversed so that its P-side abuts the bottom of case 9 again forming a junction diode therewith. I have found that a disc from a conventional selenium rectifier is ideally suited for use in the embodiment of Fig. 1 and it will be readily seen that such a disc, being in intimate contact with the bottom of the case 9 and the upper surface of the panel 14, provides a good heat transferring connection between the case 9 and the panel 14. Since the stud 13 is at the same potential as the case 9 and the collector, an insulating grommet 16 is provided seated in an opening 17 in the panel 14 and surrounding stud 13. A suitable nut and washer assembly 18 on stud 13 engages the insulating grommet 16 and pulls the case 9 of transistor 8 into tight engagement with the semi-conductor washer 15.

Comparative tests have been made between transistors mounted as shown in Fig. 1 and conventional mounting, with a significant increase in heat transfer demonstrated when mounted as in Fig. 1.

Figure 4:
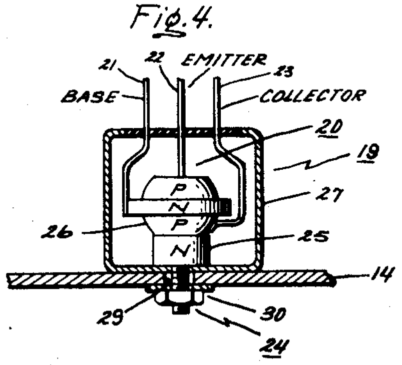
Fig. 4 illustrates a power transistor constructed in accordance with my invention.

Referring now to Fig. 4, a power transistor may initially be constructed in accordance with my invention, as shown. Here, a junction transistor 19 has a germanium crystal 20, shown here as being of the P-N-P type, with the N-type region which forms the base having an external lead 21 and with the P-type regions forming the emitter and collector respectively having external leads 22 and 23. Here, a stud 24 having its head 25 coated with semi-conductor material, such as germanium, is provided with the head 25 abutting the surface of the collector region 26. As shown in Fig. 2, the semi-conductor coating of the head 25 of stud 24 is polarized oppositely from the P-type collector region 26, i.e., with an N-region thereby forming a junction diode with the collector region 26 in the manner of Fig. 2. An enclosing metal case 27 is provided having a header 28 formed of insulating material through which the external leads 21, 22 and 23 extend. It will be seen that the stud 24 extends through a suitable opening in the case 27 and in this embodiment, the case 27, being at the same potential as the side of the semi-conductor head 25 of the stud 24 remote from the collector region 26, can be arranged directly abutting the upper surface of panel 14. Stud 24 may extend through opening 29 in the panel 14 and with nut and washer assembly 30 holding the case 27 in tight engagement with the upper surface of panel 14. It will be readily apparent that the transistor 19 may be of the N-P-N type as shown in Fig. 3, in which case the head 25 of stud 24 will be coated with semi-conductor material having a P-type characteristic. It will now be seen that heat is readily abstracted from the collector region 26 of the transistor 19 through the semi-conductor coated head 25 of stud 24 and the adjacent portion of the case 27 which abuts the upper surface of panel 14.

While Figs. 1 and 4 show separate semi-conductor members interposed between the collector and the mounting means, it will be readily understood that the crystal itself may be formed with four regions, i.e., for example, P-N-P-N, in the manner of Fig. 2, or N-P-N-P in the manner of Fig. 3, with the outer region adjacent the collector region being arranged in heat-transferring contact with the mounting means.

Figure 5:
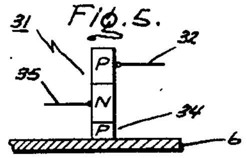
Fig. 5 is a schematic illustration showing the application of my invention to a diode.

Referring now to Fig. 5, it will be seen that my invention is also applicable to a semi-conductor diode. Here, a junction diode 31 formed of a suitable semi-conductor material, such as a germanium crystal, has the conventional N and P regions, with the P-region being connected to a suitable source of potential by a lead 32 and the N-region being connected in the remainder of the circuit by a lead 33. In certain circuit arrangements in which the diode 31 may be connected, as will be seen in Fig. 6, the N-region of the crystal 31 will not be at ground potential and thus it will not be possible to arrange the N-region in direct heat-transferring contact with the mounting means 6. Therefore, I provide an additional semi-conductor member 34 having a P-type characteristic forming another junction diode with the N-region and having a direct-heat transferring connection with the surface of mounting means 6. It will thus be seen that heat will readily be conducted from the N-region of the crystal diode 31 to the panel 6; however, the rectified current flowing in the P-N region circuit will be blocked from flowing to the panel 6 by virtue of the polarity of the junction diode formed by the member 34.

Figure 6:
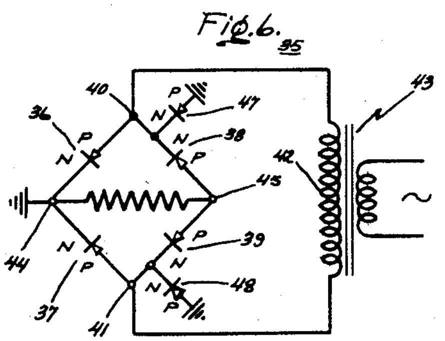
Fig. 6 is a schematic illustration showing the application of the diodes of Fig. 5 to a bridge rectifier circuit.

Referring now to Fig. 6, there is shown a bridge rectifier circuit 35 having diodes 36, 37, 38 and 39 connected in a typical full-wave bridge wave rectifying circuit with corners 40 and 41 connected across secondary winding 42 of transformer 43 and with the opposite corners 44 and 45 having the load 46 connected thereacross. Corner 44 may be connected to ground, as shown. It will now be seen that the N-regions of the diodes 36 and 37 are both at ground potential and thus may be directly connected in heat transferring relationship with the mounting panel. However, it will be seen that the corner 45 is always at a potential above ground potential and thus that neither the N nor P regions of the diodes 38 and 39 may be directly connected to the mounting panel for heat abstraction purposes. Thus, the arrangement as shown in Fig. 5 may be utilized for each of the diodes 38 and 39, the additional semi-conductor member 34 forming the added junction-diode with the N-type region being shown schematically as diodes 47 and 48 connected respectively to the N-type regions of diodes 38 and 39.

It will now be seen that I have provided an improved semi-conductor device construction applicable to both transistors and diodes in which the device may be connected in heat transferring relationship to a mounting panel or chassis which is at ground potential without current being conducted to such chassis or panel.

While I have described above the principles of my invention in connection with specific apparatus, it is to be clearly understood that this description is made only by way of example and not as a limitation to the scope of my invention.

What is claimed is:

In combination: a junction transistor having N and P-type regions respectively forming a base, collector and emitter; an enclosing case for said transistor formed of conductive material, said collector being connected to said case; a mounting panel formed of electrically conductive material; and a relatively thin wafer formed of semi-conductive material interposed between and respectively abutting said case and said panel, the surface of said wafer abutting said case being polarized oppositely from said collector thereby forming a junction diode therewith whereby heat is conducted from said collector and case to said panel and current flow to said collector to said panel is blocked.

References Cited in the file of this patent

UNITED STATES PATENTS

| | | |
|---|---|---|
| 2,655,610 | Ebers | Oct. 13, 1953 |
| 2,777,975 | Aigrain | Jan. 15, 1957 |
| 2,864,006 | Vandeven | Dec. 9, 1958 |

OTHER REFERENCES

Roka et al.: "Developmental Germanium Power Transistors," Proc. IRE, August 1954, pages 1247–1250.

UNITED STATES PATENT OFFICE

CERTIFICATE OF CORRECTION

Patent No. 2,938,130 May 24, 1960

Frank R. Noll

It is hereby certified that error appears in the printed specification of the above numbered patent requiring correction and that the said Letters patent should read as corrected below.

Column 6, line 1, for "to", second occurrence, read -- from --.

Signed and sealed this 25th day of October 1960.

(SEAL)
Attest:

EARL H. AXLINE
Attesting Officer

ROBERT C. WATSON
Commissioner of Patents